United States Patent
Durston et al.

(10) Patent No.: US 9,383,400 B2
(45) Date of Patent: Jul. 5, 2016

(54) CRITICAL CAPACITOR BUILT IN TEST

(71) Applicant: Silicon Sensing Systems Limited, Plymouth (GB)

(72) Inventors: Michael Durston, Plymouth (GB); Douglas Robert Sitch, Plymouth (GB)

(73) Assignee: SILICON SENSING SYSTEMS LIMITED, Plymouth (GB)

( * ) Notice: Subject to any disclaimer, the term of this patent is extended or adjusted under 35 U.S.C. 154(b) by 103 days.

(21) Appl. No.: 14/366,575

(22) PCT Filed: Dec. 13, 2012

(86) PCT No.: PCT/GB2012/053127
§ 371 (c)(1),
(2) Date: Jun. 18, 2014

(87) PCT Pub. No.: WO2013/093431
PCT Pub. Date: Jun. 27, 2013

(65) Prior Publication Data
US 2014/0320155 A1     Oct. 30, 2014

(30) Foreign Application Priority Data
Dec. 22, 2011    (GB) ............................. 1122165.2

(51) Int. Cl.
*G01R 27/26* (2006.01)
*G01R 31/02* (2006.01)
*G01R 19/165* (2006.01)

(52) U.S. Cl.
CPC ........ *G01R 31/028* (2013.01); *G01R 19/16576* (2013.01); *G01R 31/024* (2013.01)

(58) Field of Classification Search
CPC ............ G01S 7/40; G01R 27/04; G01P 21/00; G06F 11/24
USPC .......................... 324/111, 658, 672, 674, 679
See application file for complete search history.

(56) References Cited

U.S. PATENT DOCUMENTS

| | | | | |
|---|---|---|---|---|
| 3,453,539 | A | * | 7/1969 | Sedlack, Jr. ............... G01S 7/40 324/111 |
| 4,805,063 | A | | 2/1989 | Kataoka et al. |
| 5,121,067 | A | * | 6/1992 | Marsland ............... G01R 27/04 257/E27.012 |
| 5,753,793 | A | * | 5/1998 | Lindahl ................... G01P 21/00 73/1.15 |
| 7,348,836 | B1 | | 3/2008 | Velmurugan |
| 2008/0125990 | A1 | * | 5/2008 | Chang ..................... G06F 11/24 702/69 |
| 2010/0060331 | A1 | | 3/2010 | Xiao et al. |

FOREIGN PATENT DOCUMENTS

FR      2912814       8/2008
JP      2000230960    8/2000

OTHER PUBLICATIONS

International Search Report and Written Opinion dated May 3, 2013 in PCT/GB2012/053127.
Search Report dated Apr. 18, 2012 in Great Britain Application No. GB1122165.2.

* cited by examiner

*Primary Examiner* — Melissa Koval

(57) ABSTRACT

An electronic circuit and method for carrying out built in test of a capacitor connected to, and arranged to suppress noise at, an input of an electrical circuit is disclosed. The electronic circuit causes current pulses at the input, and monitors the voltage at the input by comparing the voltage at the input with high and/or low reference voltages, outputting a fault signal if the voltage at the input is greater than a high reference voltage or lower than a low reference voltage.

20 Claims, 3 Drawing Sheets

CRITICAL CAPACITOR BUILT IN TEST

CROSS-REFERENCE TO RELATED APPLICATIONS

This application is a national application of PCT application number PCT/GB2012/053127 filed Dec. 13, 2012 and titled "Critical capacitor built in test," which claims priority from Great Britain application number 1122165.2 filed Dec. 22, 2011 and titled "Critical capacitor built in test."

FIELD

The present invention relates to a method and apparatus for built in testing of a capacitor.

BACKGROUND

In many safety critical applications, there is a requirement that the electronic systems thereof operate with a high degree of reliability. In order to achieve a particular level of reliability, it may be necessary or desirable to incorporate a built in test capability, capable of detecting key faults, into such electronic systems. A built in test approach requires that the electronic system includes functionality that enables it to self test critical functions.

In many electronic systems, decoupling capacitors are used to stabilise a voltage at a node of an electronic circuit by, for example, suppressing power supply noise and/or switching noise. External (discrete) decoupling capacitors are frequently connected at power supply and voltage reference connections (e.g. analog ground) of integrated circuits to decouple them from other parts of the circuit. A properly connected and functional decoupling capacitor may be critical for the proper operation of the electronic system. Capacitors may also be required in other critical applications, for example in timing and filter circuits.

In broad terms, failures of a capacitor may be split into failures of the capacitor itself and failures of electrical connections between the capacitor and the other circuit elements. Both short circuit and open circuit failures are possible, for example as a result of dielectric breakdown and breaking of an electrical connection respectively.

An example of a potentially safety critical system is an accelerometer with an electronic readout circuit, which may be used to trigger the airbags or other safety devices (for example seatbelt tensioners) of a vehicle. It is important that an accelerometer used in such a context is highly reliable and, as mentioned above, this may require that the circuits associated with the accelerometer are able to detect and report fault conditions that prevent the proper operation thereof. Where a decoupling capacitor is used to reduce noise on the analog ground for such a system, it may be connected to the readout application specific integrated circuit (ASIC) via solder connections and wire bonds. Disconnection of the decoupling capacitor may result in unacceptable levels of noise on the output of the accelerometer, or unacceptable coupling between the supply voltage and the output voltage.

JP2000230960 describes an apparatus for checking for defective connector contacts during the manufacture of an electronic module. The apparatus is operable to inject a current pulse and check whether the resulting disturbance to the capacitor voltage falls within an expected range. The apparatus described does not appear to be suitable for incorporation into an electronic circuit and so can only be used during manufacture or conducting subsequent servicing operations. It is not thought to be suitable for use in detecting failures whilst the electronic module is in use.

There is a need for a method and apparatus that enables built in testing of capacitors. A method and apparatus that provides a reliable indication with the minimal potential of a false indication of a fault is preferable. Further, an on-line or continuous built in test method is preferred that enables the electronic system, of which the capacitor is a part, to continue to function properly while capacitor testing is under self test.

SUMMARY

According to a first aspect of the present invention, there is provided an electronic circuit arranged to carry out built in test of an external capacitor connected to, and arranged to suppress noise at, an input of the electronic circuit, the electronic circuit being arranged to cause current pulses at the input and comprising a fault detection circuit with at least one comparator, the fault detection circuit being arranged to compare the voltage at the input with a high voltage reference and/or a low voltage reference, and to output a fault signal if the input voltage is greater than a high voltage reference or less than a low voltage reference.

The fault detection circuit may be arranged to only output a fault signal if the input voltage is greater than a high voltage reference or less than a low voltage reference for predetermined period of time.

The fault detection circuit may comprise a low pass filter arranged to determine at least part of the predetermined period of time.

The fault detection circuit may comprise a delay circuit with digital logic arranged to output the fault signal only when the predetermined threshold has been exceeded for a predetermined number of clock cycles.

The electronic circuit may be arranged to cause the current pulses substantially in synchronicity with the clock cycles.

The electronic circuit may further comprise a current injection circuit that is arranged to intermittently inject a predetermined test current sequence at the input.

The current injection circuit may be arranged to produce a sequence of positive and negative current pulses at the input so that the net charge flow over the set is substantially zero.

The current injection circuit may be arranged to produce a sequence of positive, negative, negative, positive current pulses.

The electronic circuit may further comprise a sample and hold circuit arranged to isolate part of the electronic circuit during operation of the current injection circuit, and to maintain the input voltage supplied thereto.

The electronic circuit may further comprise a voltage reference low pass filter arranged to reject high frequency noise on the voltage reference.

The electronic circuit may be an integrated circuit. The integrated circuit may be a single application specific integrated circuit.

The electronic circuit may comprise a readout circuit for an accelerometer or gyroscope.

According to a second aspect of the invention, there is provided a method for built in test of a capacitor connected to an input of an electronic circuit, wherein the capacitor is external to the electronic circuit, and is arranged to suppress noise at the input, comprising the following steps: using the electronic circuit to cause current pulses at the input and to monitor the voltage at the input by comparing the voltage at the input with a high reference voltage and/or a low reference voltage; outputting a fault signal if the voltage at the input is greater than a high reference voltage or less than a low reference voltage.

The method may require that the voltage at the input be greater than the high reference voltage for a predetermined duration or less than the low reference voltage for a predetermined duration in order to output a fault signal.

The predetermined duration may be determined by a delay circuit comprising a low pass filter.

The predetermined duration may be determined by a delay circuit comprising digital logic that requires the predetermined threshold to be exceeded for a predetermined number of clock cycles.

The method may further comprise low-pass filtering the reference voltage prior to comparing.

The reference voltage may be provided by a potential divider.

The current pulses may result in a fault signal if the capacitor is not connected.

The voltage spikes may be created continuously during normal operation of the electronic circuit.

The voltage spikes may be created intermittently by the operation of a test circuit which is part of the electronic circuit.

Operation of the electronic circuit may comprise using a test circuit to provide a balanced set of positive and negative current pulses at the input so that the net charge flow over the set is substantially zero.

The set of current pulses may comprise a positive, negative, negative, positive sequence of pulses, each of which is substantially equal in current magnitude and duration.

The capacitor may be isolated from part of the electronic circuit during operation of the test circuit.

A sample and hold circuit may be used to maintain the input voltage supplied to the part of the circuit that is isolated from the capacitor during operation of the test circuit.

The electronic circuit may be an integrated circuit. The integrated circuit may be a single application specific integrated circuit.

The electronic circuit may comprise a readout for an accelerometer or gyroscope.

BRIEF DESCRIPTION OF THE DRAWINGS

Reference will now be made, by way of example, to the following drawings in which.

DETAILED DESCRIPTION

Figure 1:
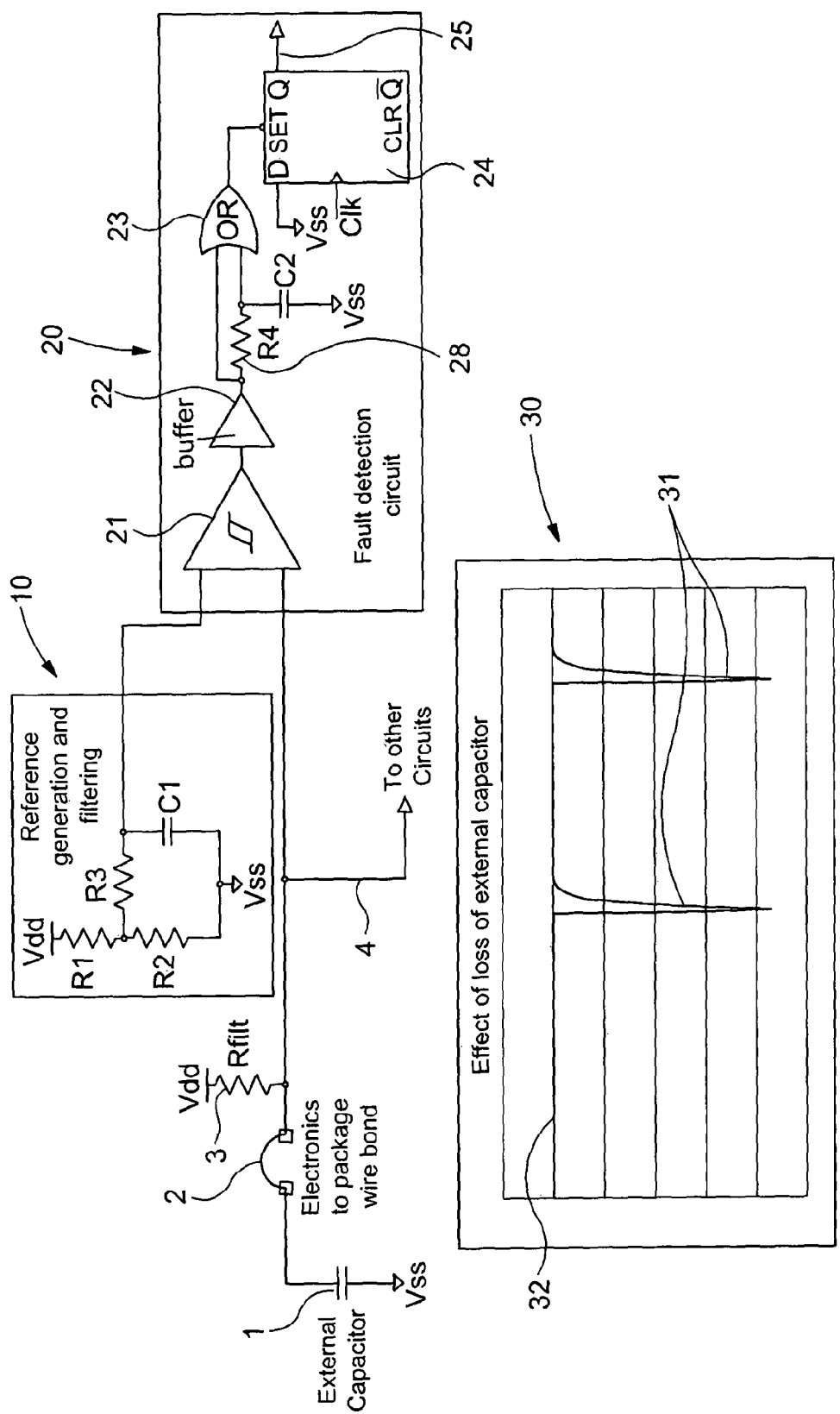
FIG. 1 is a schematic diagram of a circuit according to an embodiment of the present invention, including a graph showing example voltage pulses.

The external capacitor 1 shown in FIG. 1 is connected to a supply voltage point of an integrated circuit by a wire bond 2. The integrated circuit comprises an internal resistor 3, and a connection 4 to other circuit elements which carry out other functions (for example, drive and readout for an electrostatic MEMS accelerometer or gyroscope). The precise form of the aforementioned other circuit elements is not of importance to the invention and so they are only depicted herein in limited detail, as necessary.

The internal resistor 3 (Rfilt) is connected between a voltage supply rail (Vdd) and the external capacitor 1, and forms a low pass RC filter that decouples the supply voltage point from high frequency noise, for example power supply noise or switching noise. The external capacitor 1 may be essential to ensure good power supply noise rejection and ultimately in reducing noise on the output of the integrated circuit. Without the capacitor connected and properly functioning, the integrated circuit will still function, but will suffer from increased noise which is difficult to detect (since noise, by definition, is difficult to distinguish from the signal of interest). The noise on the supply voltage may feed through the circuit to the output.

The external capacitor 1 may for instance be a surface mount tantalum or ceramic capacitor, which is electrically connected to the integrated circuit package by surface mount soldering. Electrical connections, including solder connections and wire bonds, are common causes of failure in electronic systems. Furthermore, capacitors may be subject to a range of internal failure modes. Electrical components and electrical connections forming part of integrated circuits are in general more reliable than external connections and components, and it is therefore advantageous for any testing of the external capacitor 1 to be carried out by circuits on the integrated circuit, without the use of further external components. In the embodiment of FIG. 1, a fault detection circuit 20 is provided and conveniently forms part of the integrated circuit to which the capacitor 1 is connected, and is arranged to detect fault conditions arising from a failure of the external capacitor 1 and/or the electrical connections therefrom.

The circuit elements of the integrated circuit which are connected to the supply voltage point via the connection 4 are arranged to continually cause current pulses while the integrated circuit is in operation. For the specific example of a MEMS accelerometer readout application specific integrated circuit (ASIC), the current pulses may for instance arise as a result of the charge and discharge of the sense capacitance of a MEMS accelerometer under pulse width modulated servo control and readout.

If the capacitor 1 is connected to the supply voltage point and functioning properly, its effect is to stabilise the voltage at the supply voltage point under these transient current pulses, so that the voltage remains stable. As is known to the skilled person, a current pulse moves an amount of charge, which will result in a change in voltage on a capacitor. The change in voltage arising from a change in charge on a capacitor is inversely proportional to the capacitance. The external capacitor is therefore selected with a relatively large capacitance, for example 100 nF, which results in a very stable supply voltage point under current pulses. If the external capacitor is disconnected from the supply voltage point, for instance by a failure of a wire bond or solder joint, the current pulses will instead load the parasitic capacitance which may arise from the wire bond pad(s), tracking and solder pad, which may be of the order of 20 pF. The voltage change at the supply voltage point arising from the current pulses will therefore be much larger when the capacitor is disconnected, or has a reduced capacitance.

In order to detect the changing voltage at the supply voltage point, a voltage reference generation circuit 10 is arranged to generate a stable reference voltage with which to compare the supply voltage. For the embodiment of FIG. 1, the reference voltage is generated by a potential divider comprising two resistors (R1 and R2) between high and low voltage supply rails (Vdd and Vss respectively). An RC filter comprising a resistor (R3) and a capacitor (C1) is arranged to filter the supply voltage generated between R1 and R2, for example to reject power supply noise.

The fault detection circuit 20 comprises a comparator 21, buffer 22, low pass RC filter 28, logic gate 23, D type flip flop 24 and output 25. The comparator 21 compares the reference voltage from the voltage reference generation circuit 10 with the supply voltage. In the arrangement of FIG. 1, the reference voltage is lower than the nominal supply voltage, and is connected to the non-inverting input, so that when the supply voltage is at the nominal value, the output of the comparator 21 is low. The output from the comparator 21 is input to the buffer 22, the output of which is fed directly to a first input of the OR gate 23, and via the low pass RC filter 28 to the second input of the OR gate 23. If either input on the OR gate becomes high, a set signal is sent to the D type flip flop 24 which sets the output Q (25) high, indicating a fault condition.

The filter 28 and logic gate 23 are arranged to ensure that a fault condition is not indicated at the output 25 unless the output of the comparator 21 is high for a set period of time, defined by the RC time constant of the filter 28. Digital logic (not shown) which receives the fault signal from the fault detection circuit is arranged to require that the fault condition is present for four or more consecutive samples before the system flags a fault condition.

In order to improve the ability of the system to discriminate faults arising from a failure of the external capacitor 1 from fault conditions which may, for example, arising due to voltage supply spikes, the system may be arranged to correlate the timing of the fault indications from the comparator with current pulses drawn from the supply voltage.

The graph 30 of FIG. 1 plots time (x) against voltage (y) at the supply voltage point, which provides an example of the drop in voltage that arises under a sharp positive current pulse from the voltage supply when the external capacitor 1 is not connected, for example as a result of a failure of the wire bond 2 or another fault in the system. The low voltage spikes 31 correspond to discharging and recharging of the parasitic capacitance under pulsed current, with the steep falling edge corresponding to a current pulse discharging the parasitic capacitance, and the gradual increase back to initial voltage corresponding to recharging from the supply rail (Vdd) through the resistor 3. It will be appreciated that the presence of such spikes 31 will be sensed by the circuit 20, giving rise to an output 25 indicating that a fault has occurred.

Although the forgoing has described a circuit that is arranged to detect low voltage spikes arising from positive current flow from the supply voltage point, it will be appreciated that the approach may readily be modified to detect high voltage spikes, or both low and high voltage spikes. The testing for and detection of faults can occur continuously whilst the circuits connected to connection 4 are in operation.

In the arrangement described hereinbefore, there is a risk that if a fault were to occur in the fault detection circuit 20, the output thereof could become 'stuck' in a condition in which it outputs a signal indicating that there is no fault when, in fact, a fault has occurred. Obviously, the failure of the circuit to detect and flag a fault is unsatisfactory.

Figure 1A:
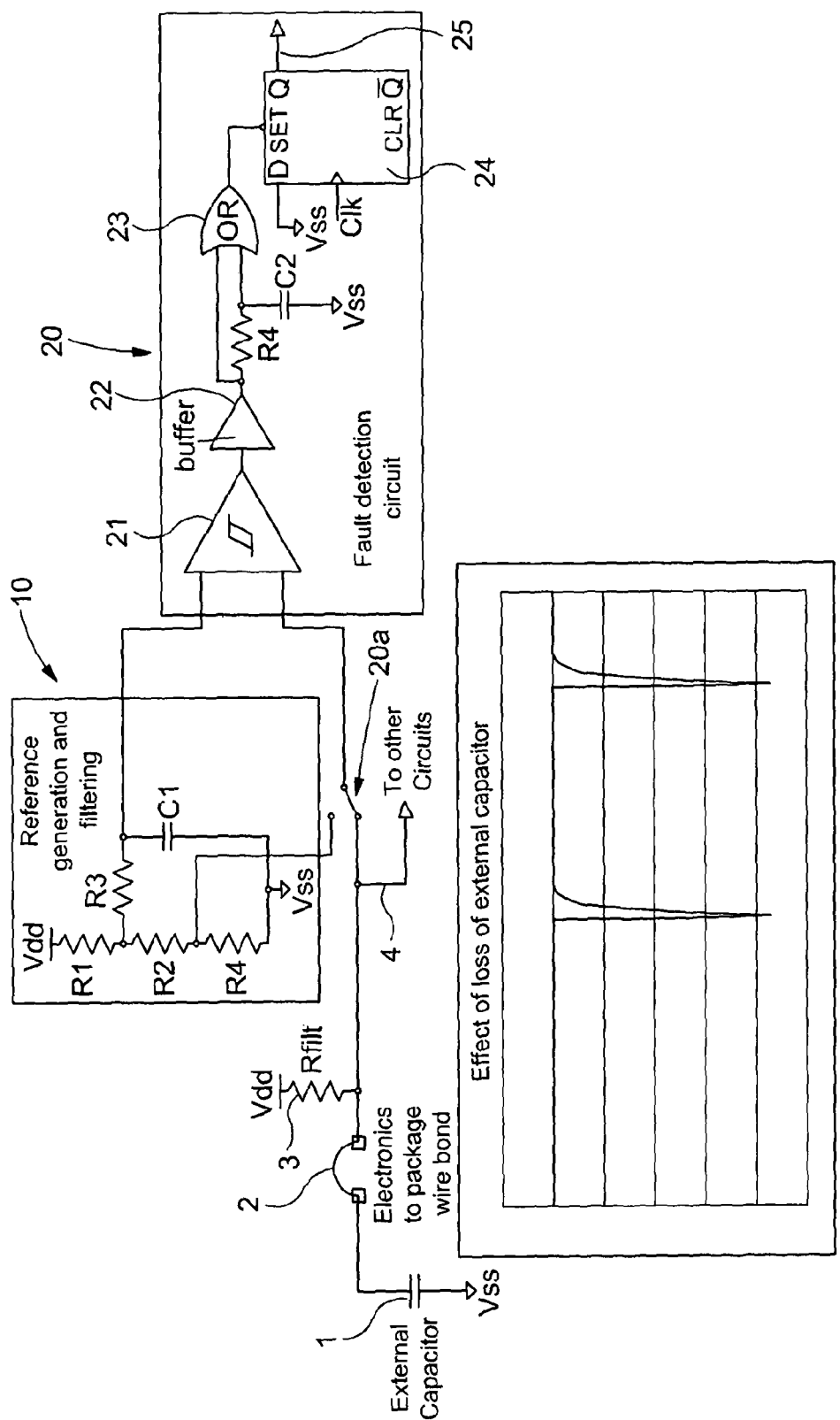
FIG. 1a illustrates a modification to the arrangement of FIG. 1.

In order to reduce the risk of such an inaccurate output occurring, the circuit of FIG. 1 may be modified as shown in FIG. 1a to include a switch 20a whereby, when desired, a fixed test input signal, instead of the supply voltage, can be applied to the comparator 21. The fixed test input signal is derived from a potential divider 20b within the voltage reference generation circuit 10, and is chosen such that the difference between the fixed test input signal and the reference voltage will cause the comparator 21 and the remainder of the fault detection circuit 20 to output a fault signal.

By supplying the fixed test signal to the input of the comparator 21, it will be appreciated that the presence of a fault anywhere within the fault detection circuit 20 can be sensed—if the test signal were applied elsewhere, for example after the comparator 21, there would be the risk of faults in components upstream of the point at which the fixed test signal is input going undetected. Furthermore, by deriving the fixed test input signal from within the voltage reference generation circuit 10, to at least some degree the system allows testing of the correct operation of the circuit 10 to be undertaken.

In use, the switch 20a is operated periodically to check that the fault detection circuit 20 is operating correctly by ensuring that it outputs a fault signal. After the test has been undertaken, the switch 20a can be returned to the position shown whereon the output of the fault detection circuit 21 should return to normal.

It will be appreciated that in this embodiment, the current pulses arise from the normal operation of the integrated circuit, and are not deleterious to the performance of the circuit when the external capacitor is connected and functioning properly.

The embodiment of FIG. 2, again comprises an external capacitor 1 connected to an integrated circuit. The integrated circuit comprises a potential divider 5. A test current injection circuit 40, fault detection circuit 20 and voltage reference buffer and hold circuit 60 are all connected to the integrated circuit in this embodiment.

The external capacitor 1 is connected to a reference voltage supply point, and is arranged to stabilise the reference voltage, and to decouple the reference voltage from the voltage supply rails, thereby rejecting power supply noise. The external capacitor 1 and the resistors of the potential divider 5 form an RC network which effectively low pass filters the supply voltage and stabilises the voltage reference. The reference voltage is generated at the midpoint of a potential divider 5, which is connected between high and low voltage supply rails (Vdd and Vss respectively). The reference voltage may be at mid-rail, and may provide the analog ground for the remaining circuit elements of the integrated circuit.

The test injection circuit 40 comprises control logic 41, a current driver 42, an electronically operated switch 43 and a drive resistor 44 through which the test pulse is injected to the rail connected to the capacitor 1. The switch 43 is arranged between the current driver 42 and the drive resistor 44, and both the current driver 42 and switch 43 are controlled by the control logic 41. The drive resistor 44 is in turn connected to the reference voltage supply point so that connecting the current driver 42 will result in positive or negative current at the reference voltage supply point.

In response to a test signal, the control logic 41 is arranged to provide a predetermined sequence of current pulses at the reference voltage supply point. The current pulses may for instance comprise a sequence of current pulses that result in no substantially no net charge input to the reference voltage supply point. Each current pulse may for example be of 2.8 µs duration, and 5 µA current. The sequence of pulses may for example be positive, negative, followed by negative positive, thereby removing subtle side effects (which may for example arise due to non-linearity), and ensuring that there is no net average effect from the sequence on the reference voltage. With the Vref capacitor 1 at the mid voltage when a positive pulse is applied the voltage spike rises exponentially to slightly above Vref. The subsequent negative pulse then creates a negative voltage spike that again has an exponential time constant but because it starts from a voltage higher than Vref it does not completely balance out with the positive spike. If an alternating sequence were used, complete cancellation of this effect may not occur, but by altering the sequence to that outlined above so that a subsequent test pulse injection is in the form of a negative pulse followed by positive pulse, the difference in the exponential voltages can be completely cancelled. An unbalanced sequence of current pulses (for example, all positive) may result in the voltage reference drifting away from its nominal value.

When the external capacitor 1 is connected, the effect of each current pulse is to create a small change in the reference voltage. For example, the effect of a 5 μA current flowing for 2.8 μs when the external capacitor 1 is 100 nF results in a maximum voltage change of 140 μV. If the external capacitor 1 is disconnected, and the same current is applied to only a parasitic capacitance of 20 pF, a maximum voltage change of 125 mV occurs, which is three orders of magnitude greater, and readily detectable by the fault detection circuit 20.

The fault detection circuit 20 of this embodiment comprises a low comparator 21 and a high comparator 26, a sample and combine circuit 27 and a fault indication output 25. The low comparator 21 is provided with a low voltage reference, and is arranged to provide a fault indication to the sample and combine circuit 27 when the voltage at the reference voltage supply point is lower than that of the low voltage reference. The high comparator 26 is provided with a high voltage reference, and is arranged to provide a fault indication to the sample and combine circuit 27 when the voltage at the reference voltage supply point is higher than that of the high voltage reference. The high and low comparator voltages may for example be set at approximately 60 mV from the nominal reference voltage (which may be mid-rail).

The sample and combine circuit 27 may, for example, only provide a fault indication on the output 25 if the comparators have provided fault indications on both a first and second pulse test. The sample and combine circuit 27 may, for example, only provide a fault condition at the output 25 if a fault has been indicated for four or more consecutive cycles of the full test sequence. The sample and combine circuit 27 may, for example, comprise a state machine.

In order to prevent relatively large changes in voltage at the voltage reference supply from feeding through into the rest of the integrated circuit, a voltage reference buffer and hold circuit 60 is provided, comprising an electronically operated switch 63, a hold capacitor 62 and a buffer amplifier 61. During a test sequence, in which the test current injection circuit 40 injects current onto the voltage reference, the switch 63 is operated to isolate the input of the voltage reference buffer and hold circuit from the injected current. The hold capacitor 62 is arranged to hold the voltage and supply it to the high impedance buffer 61, thereby providing a stable reference voltage while the test sequence is applied. The test sequence may thereby be applied periodically during the normal functioning of the integrated circuit device without adversely affecting performance.

Figure 2:
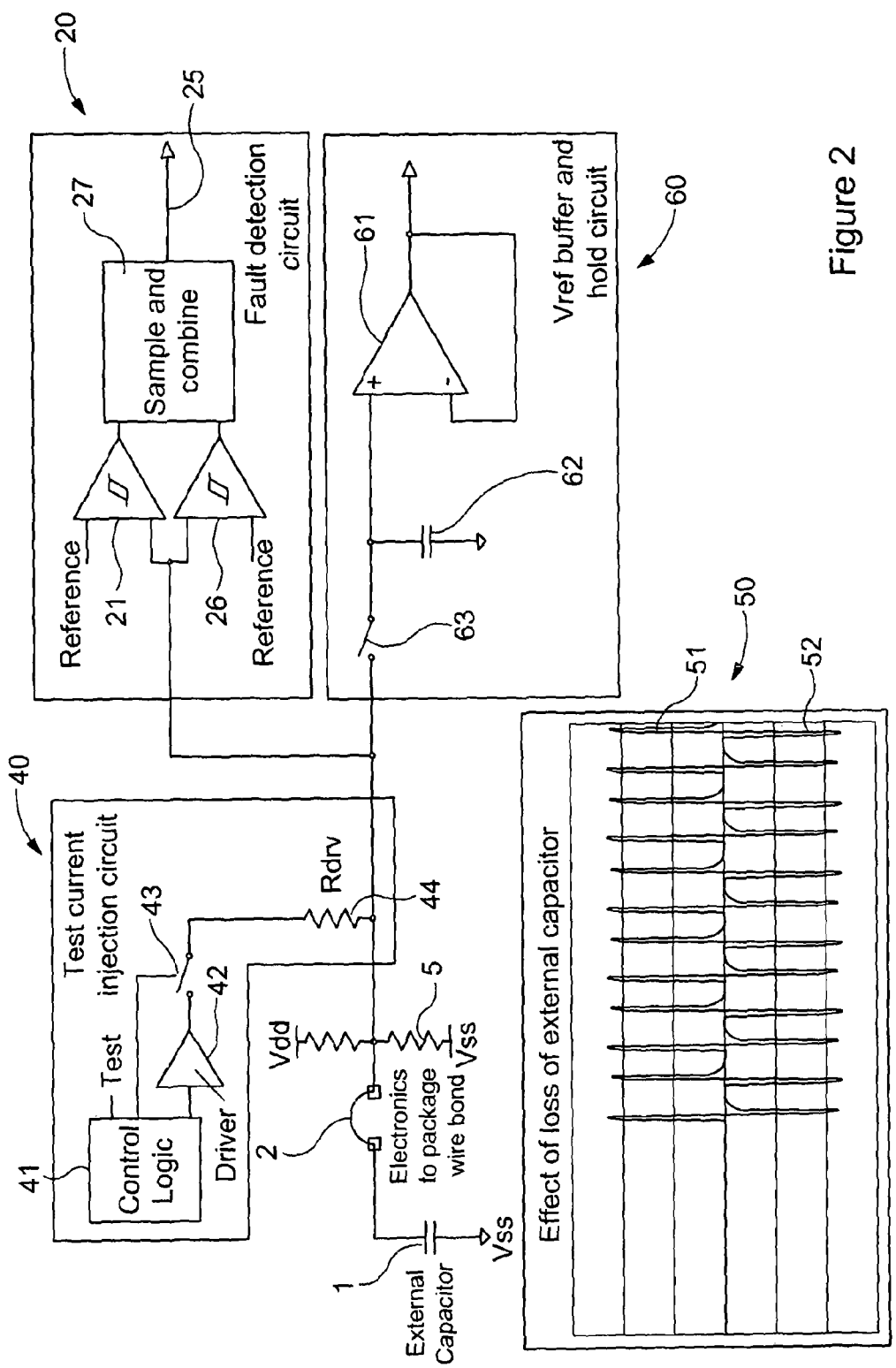
FIG. 2 is a schematic diagram of an alternative circuit according to an embodiment of the present invention, including a graph showing example voltage pulses.

The graph 50 of FIG. 2 plots time (x) against voltage (y) at the reference voltage supply point, which provides an example of the spikes in voltage 51, 52 that arise when sharp current pulses are injected when the external capacitor 1 is not connected. The low voltage spikes 52 correspond to positive current flow from the reference voltage supply point, and the low voltage spikes 52 correspond to negative current flow from the reference voltage supply point. The steep leading edge of each spike corresponds to the current pulse charging or discharging the parasitic capacitance, and the gradual change back to the initial voltage corresponds to recharging from the supply rails (Vdd) through the potential divider 5. A sequence of 6 complete test sequences of positive, negative, negative, positive current pulses is shown.

It will be appreciated that a wide range of modifications and alterations may be made to the arrangements described hereinbefore without departing from the scope of the invention.

The invention claimed is:

1. An electronic circuit for testing an external capacitor, the external circuit causing current pulses at an input and comprising:
   a voltage reference generation circuit coupled to a supply voltage and having a voltage reference low pass filter for reducing noise received with the supply voltage, the voltage reference generation circuit configured to output at least one of a high voltage reference or a low voltage reference after the noise has been reduced by the voltage reference low pass filter; and
   a fault detection circuit coupled to the voltage reference generation circuit, having at least one comparator that is configured to compare an input voltage at the input with the at least one of the high voltage reference or the low voltage reference, the fault detection circuit being configured to output a fault signal if the input voltage is greater than the high voltage reference or less than the low voltage reference.

2. The electronic circuit of claim 1, wherein the fault detection circuit is arranged to only output a fault signal if the input voltage is greater than the high voltage reference or less than the low voltage reference for predetermined period of time.

3. The electronic circuit of claim 1, wherein the fault detection circuit comprises a delay circuit with digital logic arranged to output the fault signal only when the input voltage is greater than the high voltage reference or less than the low voltage reference for a predetermined number of clock cycles.

4. The electronic circuit of claim 1, arranged to cause the current pulses substantially in synchronicity with the clock cycles.

5. The electronic circuit of claim 1, further comprising a current injection circuit that is arranged to intermittently inject a predetermined test current sequence at the input.

6. The electronic circuit of claim 5, wherein the current injection circuit is arranged to produce a sequence of positive and negative current pulses at the input so that the net charge flow over the sequence of positive and negative current pulses is substantially zero.

7. The electronic circuit of claim 6, wherein the current injection circuit is arranged to produce a sequence of positive, negative, negative, positive current pulses.

8. The electronic circuit of claim 5, further comprising a sample and hold circuit arranged to isolate part of the electronic circuit during operation of the current injection circuit, and to maintain the input voltage supplied thereto.

9. The electronic circuit of claim 1, further comprising a voltage reference low pass filter arranged to reject high frequency noise on the voltage reference.

10. The electronic circuit of claim 1, wherein the electronic circuit comprises a readout circuit for an accelerometer or gyroscope.

11. A method for built in test of a capacitor connected to an input of an electronic circuit, wherein the capacitor is external to the electronic circuit, and is arranged to suppress noise at the input, comprising the following steps:
   generating at least one of a high voltage reference or a low voltage reference by a voltage reference generation circuit that is coupled to a supply voltage and has a voltage reference low pass filter for reducing noise received with the supply voltage before outputting the at least one of the high voltage reference or the low voltage reference;

using the electronic circuit to cause current pulses at the input and to monitor the voltage at the input by comparing the voltage at the input with the at least one of the high voltage reference or the low voltage reference;

outputting a fault signal if the voltage at the input is greater than the high reference voltage or less than the low reference voltage.

12. The method of claim 11, wherein the voltage at the input must be greater than the high reference voltage for a predetermined duration or less than the low reference voltage for a predetermined duration in order to output a fault signal.

13. The method of claim 12, further comprising determining the predetermined duration by a delay circuit comprising digital logic that requires the voltage at the input to be greater than the high voltage reference or less than the low voltage reference for a predetermined number of clock cycles.

14. The method of claim 11, wherein the current pulses will result in a fault signal if the capacitor is not connected, wherein the voltage spikes are created continuously during normal operation of the electronic circuit.

15. The method of claim 14, further comprising creating voltage spikes intermittently by the operation of a test circuit which is part of the electronic circuit.

16. The method of claim 15, further comprising using a test circuit to provide a balanced set of positive and negative current pulses at the input so that the net charge flow over the balanced set of positive and negative current pulses is substantially zero.

17. The method of claim 16, wherein the balanced set of positive and negative current pulses comprises a positive, negative, negative, positive sequence of pulses, each of which is substantially equal in current magnitude and duration.

18. The method of claim 15, further comprising isolating the capacitor from part of the electronic circuit during operation of the test circuit.

19. The method of claim 18, further comprising maintaining, using a sample and hold circuit, the input voltage supplied to the part of the circuit that is isolated from the capacitor during operation of the test circuit.

20. The method of claim 11, wherein the electronic circuit comprises a readout for an accelerometer or gyroscope.

* * * * *